US006674324B1

(12) United States Patent
Ocenasek et al.

(10) Patent No.: US 6,674,324 B1
(45) Date of Patent: Jan. 6, 2004

(54) SYSTEM AND METHOD FOR PRODUCING AN AMPLIFIED SIGNAL USING PLURALITY OF AMPLITUDES ACROSS SPECTRUM (75) Inventors: Josef Ocenasek, Whippany, NJ (US); Christopher F. Zappala, Annandale, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/645,125

(22) Filed: Aug. 24, 2000

(51) Int. Cl.[7] ............................................... H03F 3/66
(52) U.S. Cl. ......................... 330/52; 330/149; 330/151
(58) Field of Search ........................... 330/52, 149, 151

(56) References Cited

U.S. PATENT DOCUMENTS 6,275,106 B1 * 8/2001 Gomez ....................... 330/151

FOREIGN PATENT DOCUMENTS

EP          0675594 A1    3/1995    ............. H03F/1/32
EP          0998028 A1    10/1999   ............. H03F/1/32

* cited by examiner

Primary Examiner—Michael B Shingleton (57) ABSTRACT

An amplifier distortion reduction system detects a plurality of amplitudes corresponding in time within a frequency band of operation. In response to at least one of the plurality of amplitudes, adjustments can be made to components within the frequency band of operation, enabling the amplifier distortion reduction system to adapt to changing operating conditions. In a feed forward embodiment having a carrier cancellation loop and IMD cancellation or distortion cancellation loop, the output of the carrier cancellation loop can be monitored and equalizer adjustments provided to reduce the amplitude of the carrier signal(s) equally over the frequency band of operation. The output of the IMD cancellation loop can be monitored and equalizer adjustments provided to reduce the IMD components equally over the frequency band of operation. Thus, processing circuitry can monitor amplitudes corresponding in time over the frequency band of operation and provide improved performance over the frequency band.

15 Claims, 3 Drawing Sheets

SYSTEM AND METHOD FOR PRODUCING AN AMPLIFIED SIGNAL USING PLURALITY OF AMPLITUDES ACROSS SPECTRUM

BACKGROUND OF THE INVENTION

1. Field of the Invention

This invention relates to a signal amplification system producing an amplified signal with reduced distortion.

2. Description of Related Art

An ideal power amplifier amplifies an input signal with no waveshape alteration. The ideal power amplifier is therefore characterized as having a transfer function (input signal vs. output signal) which is linear with no transfer function discontinuities. In practice, a power amplifier, however, has a transfer function with nonlinear and "linear" regions. For the power amplifier to achieve as near to linear operation as possible, the power amplifier is designed to operate within its linear region given the range of possible input signal amplitudes. If the input signal has an amplitude which causes the power amplifier to operate outside the linear region, the power amplifier introduces nonlinear components or distortion to the signal. When the input signal possesses peak amplitudes which cause the amplifier to compress, to saturate (no appreciable increase in output amplitude with an increase in input amplitude) or to shut-off (no appreciable decrease in output amplitude with a decrease in input amplitude), the amplifier produces an output signal that is clipped or distorted in a nonlinear fashion.

In wireless communications systems, high power amplification of signals is used to increase the power of the signal to be transmitted, for example carrier signal(s) with information modulated thereon. The distortion of the input signal causes power to be generated in adjacent channels or frequencies to corrupt or interfere with signals in the adjacent channels or frequencies, commonly referred to as spectral regrowth or adjacent channel power (ACP). The generation of adjacent channel power is of particular concern in wireless communications systems where signals being amplified are in adjacent channels or frequency bands. Wireless cellular communications systems comprise a number of base stations, geographically distributed to support transmission and receipt of communication signals to and from wireless units, which can be mobile or fixed, in the geographic region. Each base station handles voice and/or data communications over a particular region called a cell, and the overall coverage area for the cellular system is defined by the union of cells for all of the cell sites, where the coverage areas for nearby cell sites overlap to some degree to ensure (if possible) contiguous communications coverage within the outer boundaries of the system's coverage area.

In a wireless cellular communications system, a base station and a wireless unit communicate voice and/or data over a forward link and a reverse link, wherein the forward link carries communication signals from the base station to the wireless unit and the reverse link carries communication signals from the wireless unit to the base station. There are many different schemes for determining how wireless units and base stations communicate in a cellular communications system. Multi-user wireless communications systems, such as Code division multiple access (CDMA), Time division multiple access (TDMA), Global System for Mobile Communications (GSM) and orthogonal frequency division multiplexing (OFDM), combine multiple voice and/or traffic channels into a single or multiple carriers. A linear amplifier should be able to react rapidly to transmit power changes and bursty traffic variations within the transient response specifications in the microsecond and millisecond ranges while providing adequate error cancellation. There is therefore a need to devise techniques that can eliminate substantially or reduce significantly the distortion produced by the amplifier.

Feed-forward correction is routinely deployed in modern amplifiers to improve amplifier linearity with various input patterns. The essence of the feed-forward correction is to manipulate distortion, such as intermodulation (IMD) components, created by the amplifier so that at the final summing point, the distortion cancels out. Due to the unpredictability of input RF carrier pattern as well as the resultant distortion location, a known frequency component, i.e. a pilot signal, is injected in the main signal path with the distortion produced by the amplification process. In feed-forward amplifiers, the feed forward distortion reduction circuitry minimizes the pilot signal along with the distortion. As such, by designing the feed forward distortion reduction circuitry to detect and cancel the pilot signal, the distortion can also be removed.

Figure 1:
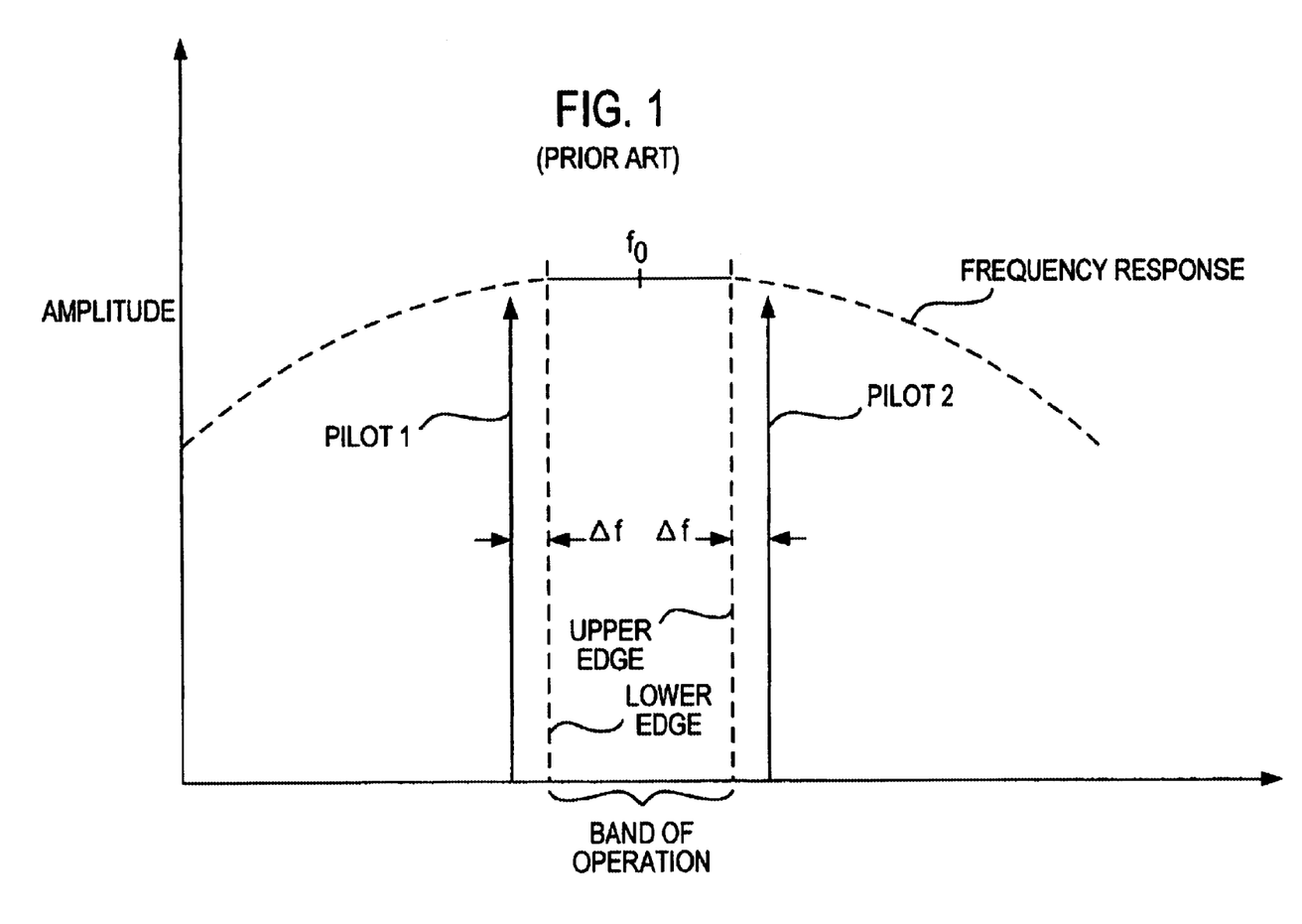
FIG. 1 shows an example frequency response curve of an RF amplifier showing the frequency within which the amplifier is operating.

The pilot signal is an electrical signal comprising at least one frequency component spectrally located within or near the frequency band of operation of the electrical circuit. A more complete description of the pilot signal is shown in FIG. 1 which shows the frequency response of a radio frequency (RF) amplifier including the location of the pilot signal. The pilot signal can be located near the lower edge of the operating band (e.g., pilot 1) and re-tuned to be located near the upper edge of the band of operation (e.g., pilot 2). The pilot is positioned a spectral distance of $\Delta f$ from an edge of the band of operation whose center frequency is $f_0$. The electrical characteristics (e.g., amplitude, phase response, spectral content) of the pilot signal are known. It should be noted that although the pilot signal is shown as having one or two spectral components, the pilot signal can be tuned to have more spectral components or be spread across the spectrum. The pilot signal is detected a spectral component at a time, and the spread spectrum pilot is de-spread and detected as a single amplitude for the spectrum.

Figure 2:
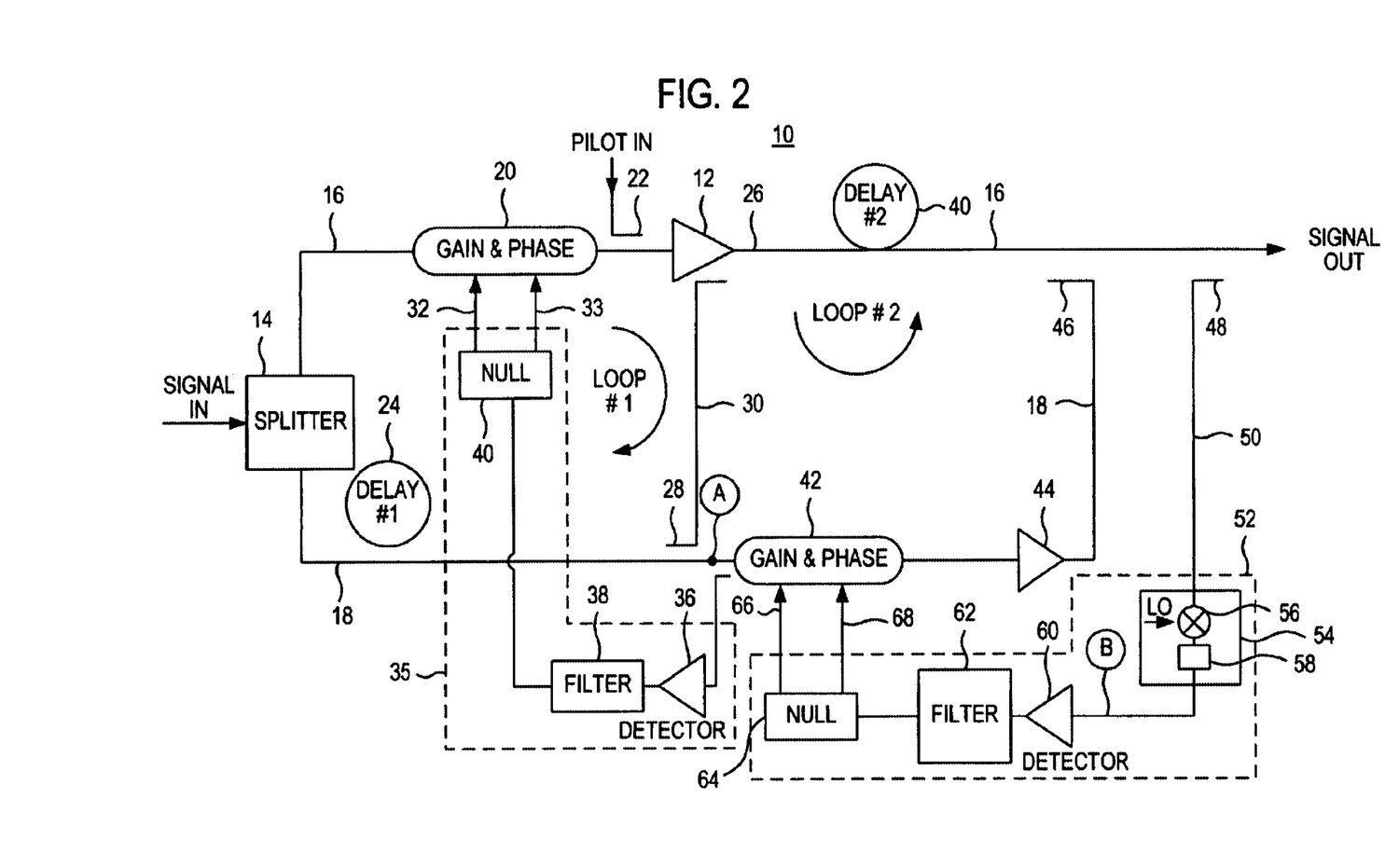
FIG. 2 is a block diagram of a feed forward distortion reduction system used for RF amplifiers.

The feed forward distortion reduction circuitry typically reduces distortion produced by the RF amplifier by applying the pilot signal to the RF amplifier and making adjustments based on information obtained from the applied pilot signal. FIG. 2 discloses feed-forward correction circuitry 10 and its use of information obtained from the pilot signal to reduce distortion produced by RF amplifier 12. An input signal, for example including at least one carrier signal with information modulated thereon, is applied to a splitter 14. The splitter 14 replicates the input signal on a main signal path 16 and a feed forward path 18. The splitter 14 is part of a carrier cancellation loop referred to as loop #1, which in addition to the splitter 14, comprises gain & phase circuit 20, coupler 22, the RF amplifier 12, delay circuit 24 and couplers 26 and 28. The signal on the main path 16 is applied to gain & phase circuit 20. The output of gain & phase circuit 20 and the pilot signal are applied to the coupler 22. Typically, the amplitude of the pilot signal is much less (e.g., 30 dB less) than the amplitude of the input signal so as not to interfere with the operation of the amplifier 12. The output of the coupler 22 is applied to the amplifier 12 whose output comprises the amplified input signal, the amplified pilot signal and distortion signals produced by the amplifier 12.

A portion of the output of the amplifier 12 is obtained from the coupler 26 and is combined at the coupler 28 via coupling path 30 with a delayed version of the input signal on the feed forward path 18 to isolate the pilot signal with distortion on the feed forward path 18. The input signal on the feed forward path 18 is sufficiently delayed by delay circuit 24 so that such signal experiences the same delay as the signal appearing at the coupler 28 via the path 30. The resulting error signal contains the distortion produced by the amplifier 12 along with any portion of the carrier signal remaining at the output of the coupler 28 and the pilot signal. The amount of carrier cancellation in the carrier cancellation loop depends on the proper gain and phase match between the two paths from the splitter 14 to the coupler 28.

The gain & phase circuit 20 adjusts the phase and gain of the input signal according to control signals on control paths 32 and 33 such that the signal appearing at the coupler 28 via the path 30 is substantially the inverse (equal in amplitude but 180° out of phase) of the delayed input signal at the coupler 28. The gain and phase control signals appearing on the control paths 32 and 33 of the gain & phase circuit 20 are derived from the signal at the output of the coupler 28 in a well known manner by sampling the output of the coupler 28 with a coupler 34 and using signal detection and control circuitry 35. In general, the signal detection and control circuitry 35 detects an error signal for the carrier cancellation loop. The error signal represents the amplitude of the signal at point A, and the signal detection and control circuitry 35 attempts to reduce the amplitude of the carrier signal(s) by providing gain and/or phase control signals.

In this embodiment, the signal detection and control circuitry 35 includes a detector 36, such as a log detector, which produces a signal representing the amplitude of the signal at point A. A filter 38 filters the output of the log detector to produce a DC-type amplitude signal representing the amplitude of the carrier signal(s). The amplitude signal is provided to a nulling circuit 40. In response to the amplitude signal, the nulling circuit 40 provides the control signals on the control paths 32 and 34 to adjust the relative gain and/or phase between the combining signals at the coupler 28 and reduce the carrier signal(s). When the carrier signal(s) is minimized, the carrier signals combined at the coupler 28 substantially cancel each other leaving at the output of the coupler 28 the pilot signal with distortion produced by the amplifier 12. Loop #1 is thus a carrier cancellation loop which serves to isolate on the feed forward path 18 the pilot signal with distortion produced by the amplifier 12.

A distortion reduction loop or loop #2 attempts to reduce the pilot signal on the main signal path 16, thereby reducing the distortion produced by the amplifier 12, using the signal at the output of the coupler 28. The pilot signal with distortion on the feed forward path 18 is fed to a gain & phase circuit 42. The output of the gain and phase circuit 42 is fed to amplifier 44 whose output is applied to coupler 46. The coupler 46 combines the amplified pilot signal and distortion on the feed forward path 18 with the signals from the amplifier 12 on the main signal path 16 (carrier signal(s), pilot signal with distortion). A delay circuit 40 on the main signal path 16 delays the signals from the output of the amplifier 12 on the main signal path 16 to experience substantially the same delay as the corresponding signals from the output of the amplifier 12 which pass over the coupling path 30 through the coupler 28 to the coupler 46.

A coupler 48 provides a signal representative of the signal at the output of the coupler 46 onto a pilot detection path 50. Because the frequency, amplitude and other electrical characteristics of the pilot signal are known, pilot detection and control circuitry 52 can detect the amplitude of the remaining portion of the pilot signal from the signal on the pilot detection path 50. The pilot detection and control circuitry 52 determines the amplitude of the pilot signal, and in response to the amplitude of the remaining pilot signal, the pilot detection and control circuitry 52 provides control signals to the phase and gain circuit 42. In general, the pilot detection and control circuitry 52 will detect the pilot signal and use this information to generate control signals onto paths 66 and 68 to cause the gain & phase circuit 42 to adjust the gain and phase of the pilot signal on the feed forward path 18 such that the pilot signal on the main path 16 as well as the distortion is substantially the inverse (equal in amplitude but 180° out of phase) of the pilot signal and the distortion on the feed forward path 18 at the coupler 46. The corresponding pilot signals and distortion substantially cancel each other at the coupler 46 leaving the carrier signal(s) at the output of the system. Therefore, loop #2 is a distortion reduction loop which attempts to cancel the pilot signal to cancel substantially the distortion produced by the amplifier 12.

In this embodiment, the pilot detection and control circuitry 52 includes pilot receive circuitry 54 which includes a mixer 56 to frequency convert the error signal on the pilot detection path 52 to a lower frequency and a filter 58 to facilitate detection of the pilot signal by a signal detector 60 at the known frequency for the pilot signal. The detector 60, such as a log detector, produces a signal representing the amplitude of the signal the output of the coupler 46. A filter 62 filters the output of the detector 60 to produce a DC-type amplitude signal representing the amplitude of the remaining pilot signal. The amplitude signal is provided to a nulling circuit 64. In response to the amplitude signal, the nulling circuit 64 provides gain and phase control signals on the control paths 66 and 68 to the phase and gain circuit 42. The control signals are provided to adjust the relative gain and phase between the signals being combined at the coupler 46 and reduce the amplitude signal, thereby reducing the remaining pilot signal. The amount of cancellation of the pilot signal indicates the amount of distortion cancellation. When the amplitude of the pilot signal is minimized, the pilot signals and distortion combined at the coupler 46 substantially cancel each other at the output of the coupler 46.

In a pilot-based feed forward amplifier distortion reduction system, the amplitude of the pilot signal is typically relatively small at the output of the distortion reduction system because of the cancellation of the pilot and the relative amplitude of the pilot signal with respect to the amplitude of the output signal. Thus, it becomes difficult to detect the pilot signal at the output of the system. To improve detection of the pilot signal at the output of the distortion reduction system, schemes are developed to generate the pilot signal at an appropriate location and to improve detection and control. Such schemes typically add costs to the systems. Pilotless feed forward distortion reduction schemes have been developed to eliminate the pilot signal, thereby eliminating the need for the pilot generation, detection and control circuitry. The pilotless feed forward reduction systems, however, do not have a known pilot signal which can be more readily detected at the output of the feed forward distortion reduction system to compensate for changing operating conditions.

A limitation in the operation of feed forward amplifier distortion reduction systems involves the ability of the feed forward amplifier distortion reduction system to operate over a wide frequency range. Feed forward distortion reduction systems require tight operating tolerances, for example, typical feed forward correction systems may require a + or −0.1 dB frequency flat response (amplitude deviation over the frequency band of operation) and a + or −1 degree phase linearity (phase deviation in the frequency band of operation) to achieve sufficient and consistent performance over the frequency band. In general, a phase difference of 179 to 181 degrees and an amplitude difference of + or −0.1 dB between the combining signals can achieve a cancellation of 30dB, and a 175–185 degree phase difference and a 2dB amplitude difference can provide almost 20 dB of cancellation. Equalizers in the main and feed forward paths of the feed forward amplifier have been used to improve the phase and amplitude flatness over frequency. Such equalizers are usually tuned in a position which yields desired performance for a given set of RF carriers and temperature and then remain fixed. However, once the temperature or RF carriers subjected to the amplifier have changed, the equalizer effectiveness deteriorates. Adjustable equalizers have been implemented using broadband power detectors as the sensor for adjustment. The broadband composite power is monitored in the feed forward amplifier architecture, and the equalizer is adjusted to minimize the composite power level detected. Because the detected power level or amplitude is over a broad frequency band, this technique can lead to non-uniform adjustments across frequency since a sloped frequency response could yield the same measurement as a flat one. Accordingly, as operating conditions change, the amplifier distortion reduction schemes can be vulnerable to amplitude and/or phase response changes in the amplifier architecture, especially amplitude and/or phase response changes over the frequency band of operation.

SUMMARY OF THE INVENTION

The present invention is an amplifier distortion reduction system that detects a plurality of amplitudes corresponding in time within a frequency band of operation. In response to at least one of the plurality of amplitudes, adjustments can be made to components within the frequency band of operation, enabling the amplifier distortion reduction system to adapt to changing operating conditions. For example, processing circuitry can use time samples to produce a frequency spectrum representation of the frequency band of operation. The processing circuitry can include an analog to digital (A/D) converter which samples and converts the radio frequency (RF) signals over the frequency band of operation into digital sample values. A digital receiver transforms the digital sample values to produce a digital domain frequency spectrum representation of the frequency band of operation, for example using a Fourier Transform. The frequency spectrum representation can be a plurality of amplitudes within the frequency band of operation which correspond in time, such as a plurality of amplitudes over frequency representing the frequency spectrum at a given instant in time. In response to the frequency spectrum representation, the digital receiver provides adjustments for components in the frequency band of operation to improve the performance of the amplitude distortion reduction system. In a feed forward embodiment, the output of the carrier cancellation loop can be monitored and equalizer adjustments provided to reduce the amplitude of the carrier signal(s) equally over the frequency band of operation. The output of the IMD cancellation loop can be monitored and equalizer adjustments provided to reduce the IMD components equally over the frequency band of operation. Thus, the processing circuitry can monitor amplitudes corresponding in time over the frequency band and provide improved performance over the frequency band.

BRIEF DESCRIPTION OF THE DRAWINGS

Other aspects and advantages of the present invention may become apparent upon reading the following detailed description and upon reference to the drawings in which.

DETAILED DESCRIPTION

Figure 3:
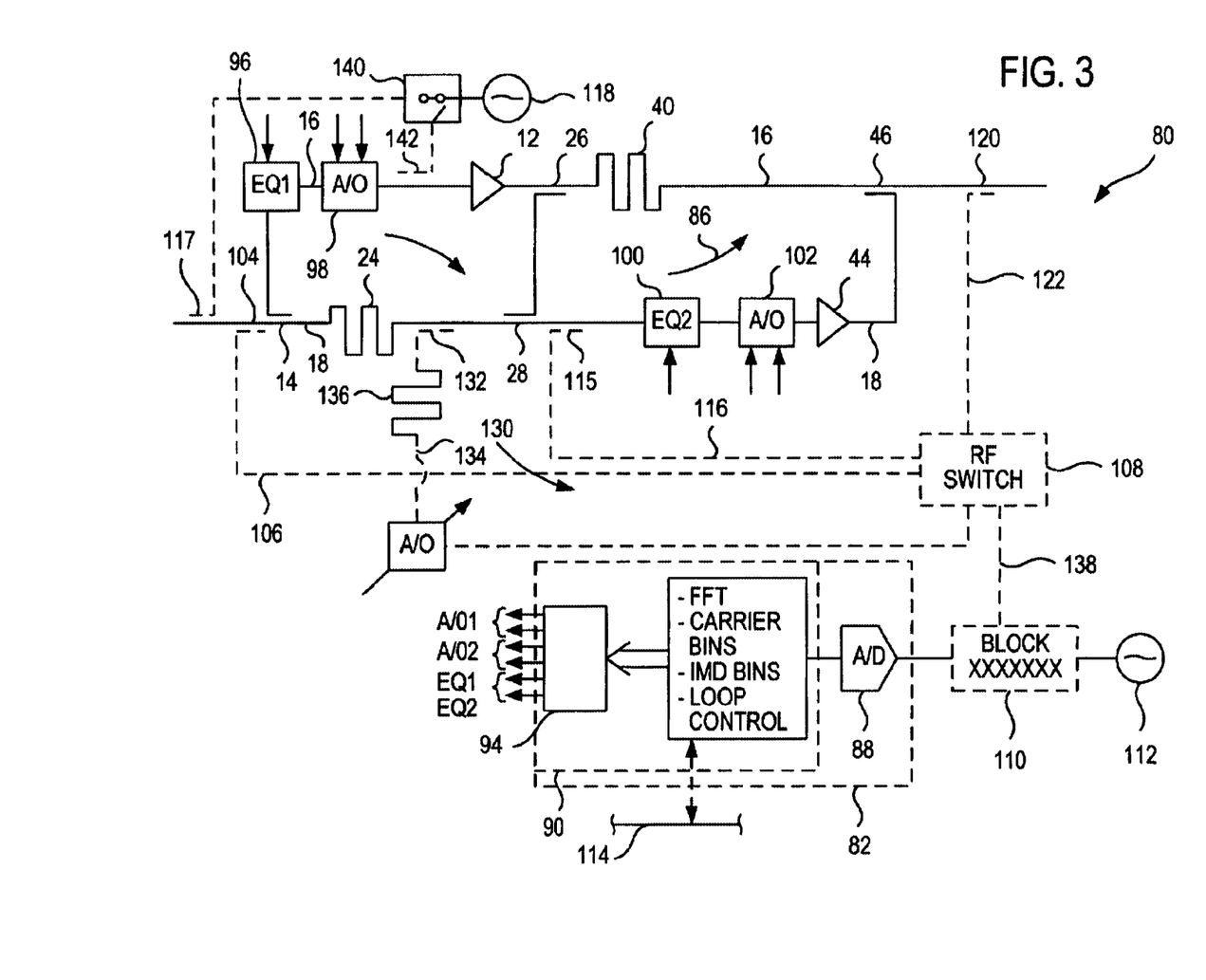
FIG. 3 shows a feed forward amplifier distortion reduction system according to principles of the present invention.

An illustrative embodiment of a amplifier distortion reduction system and method according to the principles of the present invention is described below in a feed forward arrangement. FIG. 3 shows a general block diagram of a feed forward amplifier architecture 80 in which like reference numerals indicate like components as in FIG. 2. In the feed forward amplifier architecture, processing circuitry 82 receives analog RF signals from the output of the carrier cancellation loop 84 at the output of the coupler 28 on the feed forward path 18 and/or from the output of the distortion cancellation loop 86 at the output of the coupler 46 on the main signal path 16. The processing circuitry 82 includes an analog to digital (A/D) converter 88 which digitizes the analog signals according to a sampling rate which has a bandwidth which is more than twice that of the frequency band of operation (i.e., more than the Nyquist sampling rate for the frequency band of operation). The digital sample values are provided to a digital receiver 90 which performs a Fast Fourier Transform (FFT) 92 on the digital sample values to produce a digital frequency spectrum representation of the RF frequency band of operation. The digital frequency spectrum representation provides a snapshot of the spectrum of the frequency band of operation in that a plurality of amplitudes corresponding in time within the frequency band of operation are determined. The plurality of amplitudes across the frequency band correspond in time because the amplitudes represent the amplitudes occurring at the same instant in time or at about the same time or time period. For example, the amplitudes can be average amplitudes determined from digital sample values of the bandwidth of operation processed over the same period of time, for example using a Fourier Transform, to represent the instantaneous frequency spectrum of operation.

The digital receiver 90, can be a wideband digital receiver which can detect the instantaneous frequency band of operation or a portion thereof. The frequency band of operation can be the frequency range or a portion thereof over which RF carrier(s), distortion component(s) and/or pilot signal(s) can be or are placed or positioned. The frequency band of operation can be the maximum frequency separation between RF carriers. If one wide RF carrier is used, a plurality of amplitudes corresponding in time across the carrier can be detected. Control circuitry 94 provides control signals to produce gain, phase and/or equalizer adjustments on the main path 16 and/or the feed forward path 18 to improve operation of the amplifier distortion reduction system as indicated in the digital representation of the frequency band of operation by using at least one of the plurality of amplitudes corresponding in time within the frequency spectrum. Thus, the amplifier distortion reduction system 80 can adapt to changing operating conditions, such as changing input signal(s), temperature and/or component performance, by making gain, phase and/or equalizer adjustments to signals or components in the frequency band of operation on the main path 16 and/or the feed forward path 18 in response to at least one amplitude of the frequency spectrum representation.

In accordance with another aspect of the present invention, if the processing circuitry 82 is detecting the output of the carrier cancellation loop 86, the control circuitry 94 can provide equalizer control signals to an equalizer 96 to adjust the amplitude and/or phase response of the carrier cancellation loop 84 over frequency based on or using a plurality of amplitudes within the representation of the frequency spectrum of the frequency band of operation. For example, the processing circuitry 82 can provide equalizer adjustments to reduce the carrier amplitudes equally over the frequency spectrum as reflected in the digital representation of the frequency spectrum. Additionally, the control circuitry 94 can provide gain and/or phase control signals to gain and/or phase adjusters 98 to achieve the desired response in the digital frequency domain based on at least one of the carrier amplitudes in the digital frequency spectrum. For example, the processing circuitry 82 can provide gain and/or phase adjustments to adjuster 98 to reduce the at least one carrier amplitude of the plurality of amplitudes.

In accordance with another aspect of the present invention, if the processing circuitry 82 is detecting the output of the IMD or distortion cancellation loop 86, the control circuitry 94 can provide equalizer control signals to equalizer 100 to adjust the amplitude and/or phase response of the distortion cancellation loop 86 over frequency based on or using a plurality of amplitudes within the representation of the frequency spectrum of the frequency band of operation. For example, the processing circuitry 82 can provide equalizer adjustments to reduce the distortion amplitudes equally over the frequency spectrum. Additionally, the control circuitry 94 can provide gain and/or phase control signals to gain and/or phase adjusters 100 to achieve the desired response in the digital frequency domain based on or using at least one of the plurality of amplitudes within the representation of the frequency spectrum of the frequency band of operation. For example, the processing circuitry 82 can provide gain and/or phase adjustments to adjuster 100 to reduce the at least one distortion amplitude of the plurality of amplitudes. Accordingly, the processing circuitry 82 can provide adaptive or dynamic control which can be continuous, periodic or triggered because gain, phase and/or equalizer adjustments in the carrier cancellation and/or distortion cancellation loops can be provided under different or changing operating conditions, such as changing or different RF carrier conditions, component operation and temperature ranges during the actual operation of the amplifiers 12 and 44.

In the embodiment of FIG. 3, the feed forward arrangement 80 receives the signal to be amplified, such as carrier signals with information modulated thereon. Depending on the embodiment, a coupler 104 provides a sample of the RF input signal which can be digitized by the processing circuitry 82 and a digital representation of the RF input spectrum can be obtained. For example, a digital representation of the RF spectrum can be obtained to identify carrier signals such that the carrier frequencies can be already known when detecting the carrier signals when performing carrier cancellation in the carrier cancellation loop 86 and ignored when detecting distortion to adjust the IMD cancellation loop 86. The number and nature of the carrier signals, such as TDMA (30 KHz carriers), Global System for Mobile Communications (GSM)(200 KHz carriers), CDMA (1.28 MHz carriers), wideband CDMA (5 MHz carriers), and Universal Mobile Telecommunication Systems (UMTS) (3.84 MHz carriers), can also be determined.

In certain embodiments, the coupler 104 provides a replica of the analog RF input signal onto an input detection path 106 to an RF switch 108 which enables the same processing circuitry 82 to detect signals on different detection paths 116 and 122. The RF input signal is provided to a block converter 110 tuned to the appropriate frequency spectrum, for example a 20 MHz frequency block or bandwidth, using a tunable local oscillator 112. The block converter 110 frequency converts the 20 MHz signal bandwidth, for example down-converts the signal bandwidth. The frequency converted 20 MHz bandwidth is digitized by the A/D converter 88 and the digital sample values of the 20 MHz signal bandwidth are provided to the digital receiver 90, which could include a data buffer DPRAM connected to a digital signal processor (DSP) with memory and/or flash memory. The digital receiver 90 computes a series of Fast Fourier Transforms (FFTs) on the digital sample values and performs averaging over a certain time period to obtain a digital representation of the averaged input signal spectrum. It is assumed that the carrier to IMD performance of the input signal is greater than 70 dBc for multicarrier GSM and the spectral regrowth is at least 10 dB better than the overall base station requirements for CDMA.

Active RF carrier signals are identified by the digital receiver 90 by setting up an amplitude threshold(s). Frequencies located in the active spectrum that are above this set threshold are identified as active RF carriers. The FFT frequency bins may easily be mapped to specific RF channel numbers. The processed FFT is nominally set for ~30 kHz resolution bandwidth which means that each frequency bin holds an amplitude for 30 KHz bands across the frequency spectrum. It is assumed that the minimum spacing between TDMA carriers is 270 kHz. Successive frequency bins, having roughly the same amplitude in power, are tracked by the processor. A series of approximately 7 (200 kHz/30 kHz) successive bins having similar power levels constitute a GSM RF carrier. A series of approximately 41 (1.25 MHz/30KHz) successive bins having similar power levels constitute an IS-95 CDMA carrier. This concept may be extended to include other air interfaces such as UMTS.

An alternative method of determining carrier type and locations and one that incorporates minimal processing computations involves a bus 114 connected to the digital receiver 90 and a base station controller (not shown) which has or can obtain the frequency assignments, for example of all the base station radios. The base station controller can send the active carrier information over the bus 114 to the digital receiver 90. A bus interface (not shown) could pass this carrier information to the digital receiver 90 for processing. This technique would simplify the processing algorithms and possibly improve the loop tuning time from cold start.

At the input to the amplifier distortion reduction system 10, a splitter or coupler 14 replicates the analog input signal, which can include the combined active RF carrier signal(s) in the frequency band of operation, onto a main signal path 16 and a feed forward path 18. The signal on the main signal path 16 is applied to the equalizer 96 which over a particular frequency band of operation provides an amplitude and/or phase response which can be changed by the control signals from the digital receiver 90. The equalizer 96 is used to compensate for any phase and/or amplitude nonlinearities of the amplifier 12 over the frequency band of operation. The signal is provided to a phase and/or gain circuit 98, and the output of the phase and/or gain circuit 98 is applied to the amplifier 12 whose output comprises the amplified signal which includes distortion signals or components, such as IMD components, produced by the amplifier 12. A replica of the output of the amplifier 12 is placed on a coupling path 30 and combined with a delayed version of the signal on the feed forward path 18 at the coupler 28 to isolate a replica of the distortion on the feed forward path 18 as the output of the carrier cancellation loop 84.

The distortion signal or components from the carrier cancellation loop 84 is input to the distortion or IMD cancellation loop 86. The signal on the feed forward path 18 is applied to an equalizer 100 which over a frequency band of operation provides an amplitude and/or phase response which can be changed by the control signals from the control circuitry 94. The equalizer 100 is used to compensate for any phase and/or amplitude nonlinearities of the amplifier 44 over the frequency band of operation. The distortion signal on the feed forward path 18 is applied to a gain and/or phase circuit 102 to adjust the amplitude and/or phase of the distortion. The distortion on the feed forward path 18 is combined with the amplified signal and the distortion on the main signal path 16 at the coupler 46 as the output to the IMD or distortion cancellation loop 86 to output the amplified signal with reduced distortion.

The processing circuitry 82 can receive samples or replicas of the signal, which can include any carrier signal(s) and distortion components, at the output of the carrier cancellation loop 84 and/or of the output of the IMD cancellation loop 86 and convert the resulting analog signal into a digital representation of the frequency band of operation, for example the entire frequency band of operation of the amplifier 12 and/or the amplifier 44 or at least a portion thereof, such as at least one carrier signal and IMD components making up the signal. In response to the frequency spectrum at the output to the carrier cancellation loop 84, the control circuitry 94 can provide gain and/or phase adjustment control signals to the gain and/or phase adjusters 98, for example to reduce at least one carrier amplitude across the frequency spectrum at the output to the carrier cancellation loop 84. The processing circuitry 82 can provide equalizer adjustment signals to the equalizer 96 to adjust the gain and/or phase response on the main signal path 16 over the frequency band of operation as reflected in the digital representation of the frequency band of operation, for example to reduce a plurality of carrier amplitudes equally across the frequency spectrum. In response to the frequency spectrum at the output to the distortion cancellation loop 86, the control circuitry 94 can provide gain and/or phase adjustment control signals to the gain and/or phase adjusters 102, for example to reduce at least one distortion amplitude across the frequency spectrum at the output to the carrier cancellation loop 84. The processing circuitry 82 can provide equalizer adjustment signals to the equalizer 100 to adjust the gain and/or phase response on the main signal path 16 over the frequency band of operation as reflected in the digital representation of the frequency band of operation, for example to reduce a plurality of distortion amplitudes equally across the frequency spectrum.

In the embodiment shown in FIG. 3, an RF switch 108 can be used to toggle between a carrier cancellation detection point at the output to the carrier cancellation loop 84 after the coupler 28 and a distortion cancellation detection point at the output to the distortion cancellation or reduction loop 86 after the coupler 46. At the carrier cancellation detection point, a coupler 115 provides a replica of the signal on the feed forward path 18 onto a carrier cancellation detection path 116 to the RF switch 108. The RF switch 108 can provide the signal on the carrier cancellation detection path 116 to the block conversion stage 110, for example to down-convert the bandwidth on the carrier cancellation detection path 116 of the frequency band of operation to a lower frequency range for the digital conversion of the bandwidth of operation by the A/D converter 88 of the processing circuitry 82.

The A/D converter 88 produces digital sample values of the bandwidth of operation on the carrier cancellation detection path 116 to the digital receiver 90 which performs an FFT process on the digital sample values from the A/D converter 88. The FFT process produces a digital representation of the bandwidth of operation in that the digital receiver 90 can monitor the channelized data in that the data corresponding to the carrier signals and/or IMD components are at the same relative positions within the digital bandwidth or spectrum representation as in the bandwidth of operation from the coupler 112. In this embodiment, because the carrier signal locations have been determined based on either sampling of the input signal or provided by the bus 114, frequency bins which can be associated with the active carrier signal(s) have the amplitude information which is monitored by the digital receiver 90. Alternatively, the digital receiver 90 can monitor the amplitudes across the bandwidth of operation and make a determination at this point as to which are amplitudes corresponding to the carrier signal(s) and/or the IMD or distortion components.

The digital receiver 90 can monitor the digital domain representation of the bandwidth of operation at the output of the carrier cancellation loop 84 and provide gain, phase and/or equalizer adjustments to achieve a desired spectral response indicated in the digital domain representation. For example, in response to the amplitude(s) of the active carrier signal(s) in the frequency bins, the digital receiver 90 can provide gain and/or phase control signals to the gain and/or phase adjuster 102 to reduce the amplitude(s) of the carrier signal(s) in the spectrum representation. The control signals are provided to adjust the relative gain and/or phase between the carrier signals in the frequency band of operation being combined at the coupler 28 to improve the cancellation of the carrier signal(s) as indicated in the spectrum representation. As such, the digital receiver 90 is adjusting the relative phase and/or amplitude between the carrier components of the signals from the main signal path 16 and the coupling path 30 such that the carrier components combine at the output to the coupler 28 with a phase difference of about 180 degrees and equal amplitudes.

In accordance with another aspect of the present invention, the equalizer(s) 96 can adapt to changing operating conditions by adjusting the gain and/or phase response of the equalizer(s) 96 over the frequency band of operation using a plurality of amplitudes corresponding in time over the frequency band of operation. For example, the equalizer (s) can be fully adaptive to the signal environment and updates to the equalizer(s) 96 performed continuously or periodically or triggered using the plurality of amplitudes corresponding in time in the frequency band of operation. The digital receiver 90 can measure a plurality of amplitudes corresponding in time within the bandwidth of operation from which an indication of the phase and/or amplitude flatness of the amplifier 12 across the bandwidth of operation can be determined. For example, if many carrier signals are active and are evenly spaced across frequency, carrier cancellation of the loop 84 can be evaluated across frequency. If the performance across frequency is not adequate, for example outside a performance specification, the equalizer(s) 96 are adjusted to provide a different amplitude and/or phase response over frequency on the main signal path 16 to improve performance. For example, the carrier signal(s) could be reduced equally to the lowest acceptable level to achieve the performance specification, such as 60 dBc carrier to distortion level for TDMA.

If there are no or very few active carrier signals, the digital receiver 90 can still adjust the equalizer(s) 96 using a test tone(s) injected into the RF input, for example a pilot signal. The test tone(s) can be adjusted to a level which is similar to normal carrier, for example a TDMA carrier, or can be adjusted down from that level, for example at about 41 dBm, by 15 dB in the TDMA example. By injecting the test tone(s) into the RF input, for example using a coupler 117 at the input, the carrier cancellation loop performance can be characterized. For example, the test tone can be an agile (tunable) frequency source or pilot signal generator 118, and by sweeping the source across the bandwidth of operation, for example the 20 MHz operating band and measuring the frequency response using the processing circuitry 82, the carrier cancellation can be monitored independent of base station traffic. The pilot could also be a wideband signal. Similar to the case of the active RF carriers, the coupled test tone allows the digital receiver 90 to adjust the amplitude, phase and/or equalizer across the frequency band.

In this embodiment, using the amplitudes of the carrier signal(s), the test tones and/or the IMD component(s) across frequency, the digital receiver 90 can provide equalizer adjustments that change the amplitude and/or phase response of the equalizer 96 across the frequency band of operation in response to a changing frequency spectrum due to changing operating conditions. As such, the amplifier distortion reduction system 80 can adapt to changing operating conditions, such as changing or different active RF carrier(s) conditions, information signal(s), temperature and/or component performance. The digital receiver 90 can adjust the amplitude and/or phase response of the equalizer 96 until a desired amplitude and/or phase response is achieved for the carrier cancellation loop 84 across the frequency band of operation as reflected in the digital domain spectrum representation of the output of the carrier cancellation loop 84. For example, the digital receiver 90 can adjust the amplitude and/or phase response of the equalizer 96 to reduce the carrier signal(s) equally over frequency as reflected in the digital domain spectrum or bandwidth representation.

The amplifier distortion reduction system as described above tends to reduce the power requirements for the error amplifier 44 since the total power presented to the error amplifier 44 are reduced due to improved carrier cancellation and the power levels for the carrier signal(s) are reduced equally over frequency. In addition to gain and/or phase equalizer adjustments over frequency, the equalizer 96 can include a programmable delay adjustment circuit over frequency which can compensate for subtle delay variations over frequency in the amplifier 12. These delay variations can become manifest in a splitter/combiner assembly (not shown) and parallel amplifier stages (not shown) making up the amplifier 12. The absolute delay could vary from the splitter input through the parallel amplifier stages to the combiner output when using different numbers of parallel amplifier stages, for example 4, 8 or 16 parallel amplifier stages. These delay variations across the different configurations could cause phase errors resulting in poor carrier cancellation at some frequencies. To compensate for various absolute delays, the digital receiver 90 programs the delay equalizer (shown as part of equalizer 96 but could be shown in series with the equalizer 96) to achieve improved carrier cancellation. As with other adjustments, the absolute delay is not directly measured. What is detected by the digital receiver 90 is the plurality of amplitudes over the frequency band of operation which indicates the amount of carrier cancellation across frequency. Based on this measurement, the delay equalizer is adjusted. The delay equalizer can be similar to other equalizers. In one embodiment, the delay equalizer is a variable delay in which delay elements with respective delays are in series and can be switched in and out of the main signal path 16 to change the delay on the main signal path 16, for example a two bit delay adjuster with two delay elements.

At the distortion cancellation detection point, a coupler 120 provides a replica of the signal, which can include the carrier signal(s) and distortion components, on the main signal path 16 onto an IMD or distortion reduction detection path 122 to the RF switch 108. The RF switch 108 can provide the signal on the distortion reduction detection path 122 to the block conversion stage 110, for example to down-convert the bandwidth on the distortion reduction detection path 122 of the frequency band of operation to a lower frequency range for the digital conversion of the bandwidth of operation by the A/D converter 88 of the processing circuitry 82. The A/D converter 88 produces digital sample values of the bandwidth of operation on the distortion reduction detection path 122 to the digital receiver 90 which performs an FFT process on the digital sample values from the A/D converter 88. The FFT process produces a digital representation of the bandwidth of operation in that the digital receiver 90 can monitor the channelized data in that the data corresponding to the carrier signals and/or IMD components are at the same relative positions within the digital bandwidth representation as in the bandwidth of operation from the coupler 120. In this embodiment, the distortion locations can already have been determined by monitoring the carrier cancellation loop 84 for carrier cancellation, frequency bins which can be associated with the distortion have the amplitude information which is monitored by the digital receiver 90. Alternatively, the digital receiver 90 can monitor the amplitudes across the bandwidth of operation and make a determination at this point as to which are amplitudes corresponding to distortion components.

The digital receiver 90 can monitor the digital domain representation of the bandwidth of operation at the output of the distortion reduction loop 86 and provide gain, phase and/or equalizer adjustments to produce a desired spectral response indicated in the spectrum representation. For example, in this embodiment, the digital receiver 90 can monitor the frequency bins associated with the distortion as the measurement parameter for adjusting the distortion cancellation loop 86. In response to the amplitude(s) of the IMD or distortion component(s) in the frequency bins, the control circuitry 94 of the digital receiver 90 can provide gain and/or phase control signals to the gain and/or phase adjuster 102 to reduce the amplitude(s) of the distortion component(s) in the frequency spectrum representation. The control signals are provided to adjust the relative gain and/or phase between the distortion components in the frequency band of operation being combined at the coupler 46 to reduce the distortion on the main signal path 16. When the amplitude of the distortion is minimized as indicated in the frequency spectrum representation, the distortion on the feed forward path 18 and the main signal path 16 substantially cancel each other at the output of the coupler 46. As such, the digital receiver 90 can make adjustments based on a changing frequency spectrum to adapt to changing operating conditions during operation by adjusting the relative phase and/or gain between the distortion components in the frequency band of operation from the main signal path 16 and the feed forward path 18. The relative phase and/or gain adjustments are made such that the distortion components combine at the output to the coupler 46 with a phase difference of about 180 degrees and equal amplitudes.

In accordance with another aspect of the present invention, the equalizer(s) 100 can be adapted to changing operating conditions by adjusting the gain and/or phase response of the equalizer(s) 100 over the frequency band of operation using a plurality of amplitudes corresponding in time over the frequency band of operation. For example, the equalizer(s) 96 and/or 100 can be fully adaptive to the signal environment and updates to the equalizer(s) 96 and/or 100 performed continuously or periodically or triggered using the plurality of amplitudes corresponding in time in the frequency band of operation. The digital receiver 90 can measure the distortion across frequency. For example, a plurality of amplitudes across the bandwidth of operation from which an indication of the phase and/or amplitude flatness of the amplifier 12 or 44 across the bandwidth of operation can be determined. If the performance is not adequate, the gain/phase response over the frequency band of operation of the equalizer 96 or 100 can be adjusted to achieve the desired spectrum representation. For example, the distortion should be reduced equally across the frequency band of operation and at a level that meets the performance specifications.

In addition to gain and/or phase equalizer adjustments over frequency, the equalizer 100 can include a programmable delay adjustment circuit over frequency which can compensate for subtle delay variations over frequency, for example in the amplifier 44. These delay variations could cause phase errors resulting in poor distortion reduction at some frequencies. To compensate for various absolute delays, the digital receiver 90 programs the delay equalizer (shown as part of equalizer 100 but could be shown in series with the equalizer 100) to achieve improved distortion reduction. As with other adjustments, the absolute delay is not directly measured. What is measured by the digital receiver 90 is the plurality of amplitudes over the frequency band of operation which indicates the amount of distortion reduction across frequency. Based on this measurement, the delay equalizer is adjusted. The delay equalizer can be similar to other equalizers. In one embodiment, the delay equalizer is a variable delay in which delay elements with respective delays are in series and can be switched in and out of the feed forward path 18 to change the delay on the feed forward path 18, for example a two bit delay adjuster with two delay elements.

The path budgets and the processing circuitry 82 is designed with enough dynamic range to measure the spectrum output of the amplifier distortion reduction system. The processing circuitry 82 can have enough instantaneous dynamic range to measure both the signal and distortion and have enough range to get accurate measurements of distortion even after the distortion is reduced, for example a digital receiver capable of a range of 5 dB distortion (IMD) to noise ratio when 60 dBc carrier-to-distortion (IMD) ratio is achieved. By measuring the output of the amplifier 12 directly and being able to analyze the frequency spectrum during operation, the actual distortion performance may be quantified from carrier signal(s) to distortion (IMD) to noise.

If fine tuning of the distortion reduction loop 86 is necessary, the sensitivity of the processing circuitry 82 may be improved by enabling a detector carrier cancellation loop 130. A coupler 132 on the feed forward path 18 before the coupler 28 couples off or provides a sample of a "clean" or non-distorted signal, such as the carrier signal(s) onto a detector carrier cancellation path 134. The signal is delayed by a delay 136 by the proper amount, matching the signal delay at the output of the distortion reduction system. The switched RF front end is configured to allow both the distortion cancellation loop 86 output signal and the output of the detector carrier cancellation loop 130 to be combined at a coupler 138 to reduce the amplitude of the carrier signal(s) when the digital receiver 90 is monitoring the distortion cancellation loop 86. The amplitude and phase of the carrier signal(s) on the detector carrier cancellation path 134 is adjusted until the carriers are minimized after the output of the coupler 138. Once minimized, a high gain preamp stage (not shown) can be switched into the RF path at the front end of the block converter 110, thereby improving the distortion detection and sensitivity of the digital receiver 90. The result is an improved distortion to noise ratio, such as about 20 dB, when measuring the amplifier distortion, for example when the IMD cancellation loop 86 is tuned near the 60 dBc carrier-to-distortion ratio level.

If the digital receiver 90 determines that the tuning of the IMD cancellation loop 86 by directly measuring the IMD components is presenting a problem, pilot assisted tuning may be enabled. For example, a switch 140 can be used route the pilot signal(s) to a coupler 142 which injects the pilot signal into the main signal path 16 before the amplifier 12. Tuning of the IMD cancellation loop 86 may become less robust when downlink power control is enabled for the base station. This would result in large changes to the carrier RF power, and therefore larger variations in the distortion measurements. The digital receiver 90 will determine if power control is enabled and if the standard deviation of the IMD measurements is too great. If this occurs, pilot assisted tuning will be enabled. In this embodiment, a continuous wave (CW) pilot is injected in the coupler 142 on the main signal path 16 at a frequency which is not occupied by carriers. The level of the pilot is such that it is comparable to an absolute IMD level. The IMD cancellation loop 86 would then be tuned by looking at the frequency bin associated with the pilot(s). The loop would be tuned as it was before, by the IMD cancellation loop 86 to reduce the amplitude of the pilot signal.

Accordingly, using the amplitudes of the IMD component(s) and/or the pilot signal(s), the digital receiver 90 can provide equalizer adjustments that change the amplitude and/or phase response of the equalizer 100 across the frequency band of operation. The digital receiver 90 can adjust the amplitude and/or phase response of the equalizer 100 until a desired amplitude and/or phase response for the distortion cancellation loop 86 is achieved as reflected in the amplitude(s) of the IMD component(s) and/or the pilot signal(s) across the frequency band of operation in the digital domain bandwidth representation of the output of the distortion reduction loop 86. For example, the digital receiver 90 can adjust the amplitude and/or phase response of the equalizer 100 to reduce the IMD, pilot signal(s) or distortion equally across frequency as reflected in the digital domain bandwidth representation. Additionally, the digital receiver 90 can adaptively tune the distortion reduction loop 86 under different RF carrier and amplifier conditions to provide more consistent performance across the frequency band of operation.

In addition to the embodiment described above, alternative configurations of the amplifier distortion reduction system according to the principles of the present invention are possible which omit and/or add components and/or use variations or portions of the described system. For example, the above embodiments are described in a feed forward arrangement, but other embodiments are possible which provide relative gain and/or phase and/or equalizer adjustments using a wideband receiver which provides amplitude measurements at different frequencies across a frequency band of operation. For example, embodiments could be used to adapt to changing conditions during operation of a predistortion architecture where the gain and/or phase adjustments are made to the frequency band of operation before amplification based on at least one amplitude of the plurality of amplitudes within the frequency band of operation after amplification and prior to transmission. In a personal communications systems (PCS) band in the range of 1930–1990 MHz, the digital receiver 90 can provide amplitude measurements at different frequencies over a 20 MHz sub-band, which can be defined as the instantaneous frequency range where RF carrier(s) can be placed or the maximum frequency separation between RF carriers. Depending on the application, the carrier cancellation loop 84 will typically achieve about 12–32 dB of carrier cancellation (preferably greater than 20 dB), and the IMD cancellation loop 86 will typically achieve about 12–32 dB of distortion cancellation over the frequency band of operation (preferably greater than 20 dB).

Depending on the application, the relative gain and/or phase circuitry and/or equalizer circuitry can be positioned in different locations and/or paths within the feed forward amplifier and other distortion reduction arrangements. For example the gain and/or phase adjustment circuit 98 could be located on the path 18 before the coupler 28; the gain and/or phase adjuster 102 could be located on the path 16 after the coupler 26; or the gain and phase adjustment circuitry 96 and 98 could be located at both locations. The amplitude of the signals can be measured or represented in different ways, such as voltage, current, energy, power or intensity, but the amplitude of the signals in this specification generally refer to the power level although in the analog time domain, amplitude can refer to voltage level.

Furthermore, the amplifier distortion reduction system has been described using a particular operation for processing circuitry with an A/D converter, but it should be understood that the amplifier distortion reduction system and portions thereof can be implemented in application specific integrated circuits, software-driven processing circuitry, firmware, programmable logic devices, hardware or other arrangements of discrete components as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of producing an amplified signal with reduced distortion under changing operating conditions, said method comprising:

adjusting at least one component in a frequency band of operation in response to at least one detected amplitude of a plurality of detected amplitudes of a frequency spectrum of the frequency band of operation at a particular time or time period where the amplitudes are detected by
obtaining a replica of said frequency band of operation at a detection point onto a detection path;
converting samples of said frequency band of operation into digital values and
performing a fourier transform using said digital values to produce a digital representation of said frequency band of operation thus producing said plurality of detected amplitudes over said frequency band of operation.

2. The method of claim 1 comprising:
splitting a signal to be amplified onto a main signal path and a feed forward path;
amplifying said signal on said main signal path to produce an amplified signal with distortion on said main signal path;
sampling said amplified signal with said distortion to obtain a replica of said amplified signal with said distortion on a coupling path;
combining said signal on said feed forward path with said replica of said amplified signal and said distortion on said coupling path to produce said distortion on said feed forward path;
wherein said sampling said frequency band of operation is at a detection point on said feed forward path after said combining; and
wherein said adjusting is in response to said amplitudes at said detection point.

3. The method of claim 1 comprising:
splitting a signal to be amplified onto a main signal path and a feed forward path;
amplifying said signal on said main signal path to produce an amplified signal with distortion on said main signal path;
sampling said amplified signal with said distortion to obtain a replica of said amplified signal with said distortion on a coupling path;
combining said signal on said feed forward path with said replica of said amplified signal and said distortion on said coupling path to produce said distortion on said feed forward path;
applying said distortion on said feed forward path to a gain and/or phase circuit to adjust the amplitude and/or phase of the distortion on said feed forward path;
combining said distortion on said feed forward path with said amplified signal and said distortion on said main signal path to output the amplified signal with reduced distortion on said main signal path;
wherein said sampling said frequency band of operation is at a detection point on said main signal path after said combining; and
wherein said adjusting is at said applying in response to said amplitudes at said detection point.

4. The method of claim 1 comprising:
splitting a signal to be amplified onto a main signal path and a feed forward path;
amplifying said signal on said main signal path to produce an amplified signal with distortion on said main signal path;
sampling said amplified signal with said distortion to obtain a replica of said amplified signal with said distortion on a coupling path;
combining said signal on said feed forward path with said replica of said amplified signal and said distortion on said coupling path to produce said distortion on said feed forward path;
applying said distortion on said feed forward path to a gain and/or phase circuit to adjust the amplitude and/or phase of the distortion on said feed forward path;
combining said distortion on said feed forward path with said amplified signal and said distortion on said main signal path to output the amplified signal with reduced distortion;

sampling said frequency band of operation at a first detection point on said feed forward path after said combining;

sampling said frequency band of operation at a second detection point on said main signal path after said combining; and switching between said first detection point and said second detection to make adjustments in response to said amplitudes at said first detection point and said second detection point.

5. The method of claim 1 wherein said adjusting comprising:

making relative gain and/or phase adjustments between signals within said frequency band of operation to be combined in response to at least one of said plurality of amplitudes.

6. The method of claim 1 wherein said adjusting comprising:

changing equalizer gain and/or phase response over said frequency band of operation for signals in said frequency band of operation on a path in response to said plurality of amplitudes.

7. The method of claim 1 wherein said adjusting comprising:

changing equalizer delay response over said frequency band of operation for signals in said frequency band of operation on a path in response to said plurality of amplitudes.

8. An amplifier distortion reduction system comprising:

a detection path receives a frequency band of operation; and processing circuitry receives said frequency band of operation on said detection path and produces a plurality of amplitudes of a frequency spectrum of the frequency band of operation at a particular time or time period and provides adjustments for said frequency band of operation in response to at least one of said plurality of amplitudes where the system further comprises:

a first splitter receives a signal to be amplified and provides a replica of said signal in said frequency band of operation onto a main signal path and a feed forward path;

a first amplifier on said main signal path amplifies said signal on said main signal path to produce an amplified signal with distortion on said main signal path;

a first coupler couples a replica of said amplified signal with said distortion onto a coupling path;

a second coupler combines said signal on said feed forward path with said replica of said amplified signal and said distortion on said coupling path to produce said distortion on said feed forward path;

a first detection path said frequency band of operation from a first detection point after said second coupler on said feed forward path;

said processing circuitry providing gain and/or phase adjustments based on said at least one of said amplitudes over said frequency band of operation at a first detection point;

a third coupler combines said distortion on said feed forward path with said amplified signal and said distortion on said main signal path to output the amplified signal with reduced distortion on said main signal path;

a second detection path receives said frequency band of operation at a second detection point after said third coupler;

said processing circuitry providing gain and/or phase adjustments based on said amplitudes over said frequency band of operation at said second detection point; and a switch receives said frequency band of operation from said first detection path and said second detection path and switches between said first detection path and said second detection path to provide said frequency of operation from said first detection point and said second detection point to said processing circuitry to make amplitude and/or phase adjustments in response to said amplitudes at said first detection point and said second detection point.

9. The system of claim 8 comprises:

a first splitter receives a signal to be amplified and provides a replica of said signal onto a main signal path and a feed forward path;

a first amplifier on said main signal path amplifies said signal on said main signal path to produce an amplified signal with distortion on said main signal path;

a first coupler couples a replica of said amplified signal with said distortion onto a coupling path;

a second coupler combines said signal on said feed forward path with said replica of said amplified signal and said distortion on said coupling path to produce said distortion on said feed forward path;

said detection path receives said frequency band of operation from a detection point after said second coupler on said feed forward path; and said processing circuitry providing gain and/or phase adjustments based on said at least one of said amplitudes over said frequency band of operation at said detection point.

10. The system of claim 8 comprises:

a first splitter receives a signal to be amplified and provides a replica of said signal onto a main signal path and a feed forward path;

a first amplifier on said main signal path amplifies said signal on said main signal path to produce an amplified signal with distortion on said main signal path;

a first coupler couples a replica of said amplified signal with said distortion onto a coupling path;

a second coupler combines said signal on said feed forward path with said replica of said amplified signal and said distortion on said coupling path to produce said distortion on said feed forward path;

a gain and/or phase circuit on said feed forward path receives said distortion to adjust the amplitude and/or phase of the distortion on said feed forward path;

a third coupler combines said distortion on said feed forward path with said amplified signal and said distortion on said main signal path to output the amplified signal with reduced distortion on said main signal path;

said detection path receives said frequency band of operation from a detection point after said third coupler; and said processing circuitry providing gain and/or phase adjustments based on said amplitudes over said frequency band of operation at said detection point.

11. The system of system of claim 8 further comprising:

a fourth coupler at said detection point provides a replica of said frequency band of operation at a detection point onto a detection path; and said processing circuitry comprising:

an analog to digital converter converts samples of said frequency band of operation into digital values; and a digital receiver forms averages of said digital values over a period of time to produce said plurality of amplitudes over said frequency band of operation.

12. The system of claim 11 comprising:

said digital receiver performing a fourier transform using said digital values to produce a digital representation of said frequency band of operation.

13. The system of claim 11 wherein said digital receiver is responsive to at least one of said plurality of amplitudes to produce relative gain and/or phase adjustments between signals in said frequency band of operation to be combined.

14. The system of claim 11 wherein said digital receiver is responsive to said plurality of amplitudes in said frequency band of operation to produce gain and/or phase equalizer adjustments over said frequency band of operation to signals in said frequency band of operation on a path.

15. The system of claim 11 wherein said digital receiver makes equalizer delay adjustments over said frequency band of operation to signals in said frequency band of operation on a path in response to said plurality of amplitudes.

* * * * *